(12) United States Patent
Kikushima et al.

(10) Patent No.: US 8,018,127 B2
(45) Date of Patent: Sep. 13, 2011

(54) FLEXURAL RESONATOR ELEMENT AND FLEXURAL RESONATOR FOR REDUCING ENERGY LOSS DUE TO HEAT DISSIPATION

(75) Inventors: Masayuki Kikushima, Ina (JP); Takashi Yamazaki, Shiojori (JP)

(73) Assignees: Epson Toyocom Corporation, Tokyo (JP); Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/706,728

(22) Filed: Feb. 17, 2010

(65) Prior Publication Data

US 2010/0207495 A1    Aug. 19, 2010

(30) Foreign Application Priority Data

Feb. 18, 2009    (JP) ................................. 2009-034861

(51) Int. Cl.
*H03H 9/19* (2006.01)
(52) U.S. Cl. ...................................................... 310/370
(58) Field of Classification Search .................... 310/370
See application file for complete search history.

(56) References Cited

U.S. PATENT DOCUMENTS

| | | | |
|---|---|---|---|
| 6,806,797 B2 | 10/2004 | Kikushima | |
| 7,397,172 B2 | 7/2008 | Kikushima | |
| 2009/0115294 A1 | 5/2009 | Kikushima | |
| 2009/0158566 A1* | 6/2009 | Hagelin et al. ................ | 29/25.35 |

FOREIGN PATENT DOCUMENTS

| JP | 55138916 A | * | 10/1980 |
|---|---|---|---|
| JP | U-2-32229 | | 2/1990 |
| JP | A-2004-7428 | | 1/2004 |
| JP | A-2004-282230 | | 10/2004 |
| JP | A-2004-336207 | | 11/2004 |
| JP | A-2004-349856 | | 12/2004 |
| JP | A-2004-350015 | | 12/2004 |
| JP | A-2005-123828 | | 5/2005 |
| JP | A-2005-354649 | | 12/2005 |
| JP | 2006060727 A | * | 3/2006 |
| JP | A-2006-86726 | | 3/2006 |
| JP | A-2006-86996 | | 3/2006 |
| JP | A-2006-121411 | | 5/2006 |

(Continued)

OTHER PUBLICATIONS

Roszhart, "The Effect of Thermoelastic Internal Friction of the Q of Micromachined Silicon Resonators," Tech. Dig. Solid-State Sens. Actuator Workshop, Hilton Head, South Carolina pp. 13-16, 1990.

(Continued)

*Primary Examiner* — J. SanMartin
(74) *Attorney, Agent, or Firm* — Oliff & Berridge PLC

(57) ABSTRACT

A flexural resonator element includes a base body and a beam with a groove and a through-hole, the beam being extended in a Y direction from the base body and flexurally vibrating in an X direction orthogonal to the Y direction, the groove being formed on a surfaces of the beam perpendicular to a Z direction orthogonal to the X direction and the Y direction, and the through-hole having a smaller width in the X direction than a width of an opening of the groove in the X direction and penetrating from an inner surface of the groove formed on the surface of the beam to a surface of the beam opposite to the surface of the beam having the groove.

12 Claims, 11 Drawing Sheets

FOREIGN PATENT DOCUMENTS

| JP | A-2006-148856 | | 6/2006 |
|---|---|---|---|
| JP | 2006217603 A | * | 8/2006 |
| JP | 2006270335 A | * | 10/2006 |
| JP | A-2009-117939 | | 5/2009 |
| JP | 2009212670 A | * | 9/2009 |
| JP | 2010010734 A | * | 1/2010 |

OTHER PUBLICATIONS

Zener at al., "Internal Friction in Solids, III. Experimental Demonstration of Thermoelastic Internal Friction," *Physical Review*, vol. 53, pp. 100-101, Jan. 1, 1938.

Zener, "Internal Friction in Solids, II. General Theory of Thermoelastic Internal Friction," *Physical Review*, vol. 53, pp. 90-99, Jan. 1, 1938.

Zener, "Internal Friction of Solids, I. Theory of Internal Friction in Reeds," *Physical Review*, vol. 52, pp. 230-235, Aug. 1, 1937.

Itoh at al., "Analysis of Q-Value of Quartz Crystal Tuning Fork Using Thermoelastic Coupling Equations," *Japanese Journal of Applied Physics*, vol. 48, pp. 07GF03-1-07GF03-5, Nagano, Japan, Jul. 21, 2009.

"36th EM Symposium," Kogakuin University, Shinjuku Campus, May 17, 2007 (with translation).

* cited by examiner

FLEXURAL RESONATOR ELEMENT AND FLEXURAL RESONATOR FOR REDUCING ENERGY LOSS DUE TO HEAT DISSIPATION

BACKGROUND

1. Technical Field

The present invention relates to a flexural resonator element and a flexural resonator.

2. Related Art

In general, a flexural resonator element includes a vibrating beam. Flexural vibration of the beam causes oscillation to drive the flexural resonator element. When the flexural resonator element is driven, flexural deformation of the beam repeatedly occurs. At a certain moment, when the beam is flexurally deformed, compression displacement is caused in a region near a first side surface of the beam in a deforming direction, and expansion displacement is caused in a region near a second side surface of the beam opposite to the first side surface thereof. Thereby, at the moment, temperature in the compressed region of the beam increases, whereas temperature in the expanded region of the beam decreases. Then, at a next moment, the beam is deformed in a direction opposite to the above deforming direction, whereby the compressed region and the expanded region are switched each other.

When focusing attention on the compressed or expanded region, a cycle of increase and decrease in temperature is repeated in the region by vibration of the beam. Accordingly, when heat input or output occurs between the compressed or expanded region and another region, vibration energy of the beam is dissipated as heat energy, reducing vibration energy efficiency in the flexural resonator element. Such an energy loss is more noticeable in more compact flexural resonator elements and seems to be one of reasons why miniaturization of flexural resonator elements results in a small Q value.

To solve the problem, for example, JP-UM-A-2-032229 discloses a resonator including a hole and a groove. The hole has a same opening area both on upper and lower surfaces of a beam to allow a compressed or expanded region to be structurally independent from an other region. The groove is provided to delay the input or output of heat between the compressed or expanded region and the other region.

Miniaturization of flexural resonator elements has increasingly been demanded. To meet the demand, there is used a beam having an extremely small width. This makes it very difficult to form a groove as in the conventional art on the beam in order to increase the efficiency in the resonator element. In other words, although there is a need for formation of a narrow groove with a large depth, it is more difficult to form a narrower groove by an ordinary etching process. Additionally, mechanical strength of the beam is reduced by formation of the penetrating through-hole having the same opening area both on the upper and the lower surfaces of the beam.

Furthermore, a wiring electrode formed on the beam having a small width needs to also have a small size. This tends to cause wiring electrode breaking or unnecessary short circuit.

SUMMARY

An advantage of the present invention is to provide a flexural resonator element that can reduce energy loss and can be easily produced although compact in size, thus ensuring high reliability. Another advantage of the invention is to provide a flexural resonator including the flexural resonator element.

A flexural resonator element according to a first aspect of the invention includes a base body and a beam with a groove and a through-hole, the beam being extended in a Y direction from the base body and flexurally vibrating in an X direction orthogonal to the Y direction, the groove being formed on a surface of the beam perpendicular to a Z direction orthogonal to the X direction and the Y direction, and the through-hole having a smaller width in the X direction than a width of an opening of the groove in the X direction and penetrating from an inner surface of the groove formed on the surface of the beam to a surface of the beam opposite to the surface of the beam having the groove.

In the flexural resonator element above, energy loss is reduced, and the flexural resonator element having a compact size can be easily produced. In addition, the flexural resonator element produced is highly reliable.

Preferably, in the flexural resonator element, the through-hole includes a plurality of through-holes, the plurality of through-holes being formed in the groove.

Preferably, in the flexural resonator element, the groove formed on the at least one surface of the beam includes two grooves.

Preferably, in the flexural resonator element, the two grooves are formed on one of two surfaces of the beam perpendicular to the Z direction.

Preferably, in the flexural resonator element, each of the two grooves is formed on a different one of two surfaces of the beam perpendicular to the Z direction.

Preferably, in the flexural resonator element, the through-hole penetrates from the inner surface of the groove formed on one of the two surfaces of the beam to the inner surface of the groove formed on an other one of the two surfaces of the beam.

Preferably, in the flexural resonator element, the beam includes a first electrode provided on the inner surface of the groove, a second electrode provided on a surface of the beam perpendicular to the X direction, and a plug provided on an inner surface of the through-hole.

Preferably, in the flexural resonator element, the base body and the beam are made of quartz crystal.

Preferably, the flexural resonator element is of a tuning fork type in which the beam includes two cantilevered beams extended in parallel to each other from the base body.

Preferably, in the flexural resonator element, the base body includes a base portion and a pair of connecting portions extended from the base portion in directions opposite to each other, and the beam includes a pair of detection beams extended from the base portion in directions opposite to each other and two pairs of driving beams extended from the connecting portion in directions opposite to each other.

Preferably, the flexural resonator element is of a double-ended tuning fork type in which the base body includes two base bodies, the beam includes two beams formed in parallel to each other, opposite ends of each of the two beams being supported by the two base bodies, and the groove formed on the each beam includes four grooves, each two of the four grooves being formed on a different one of the two surfaces of the beam perpendicular to the Z direction.

Preferably, in the flexural resonator element of the double-ended tuning fork type, the base bodies form a frame-shaped portion having an opening portion formed within the frame-shaped portion, and the two beams are formed in parallel to each other in the opening portion, the opposite ends of each of the beams being supported by the frame-shaped portion of the base bodies.

Preferably, in the flexural resonator element, the each two grooves formed on the different one of the two surfaces of the beam are oriented in mutually opposite directions, and the through-hole penetrates from the inner surface of each of the grooves formed on one of the two surfaces to the inner surface of each of the grooves formed on an other one of the surfaces.

A flexural resonator according to a second aspect of the invention includes the flexural resonator element of the first aspect, a casing housing the flexural resonator element, and a cover sealing the casing.

In the flexural resonator of the second aspect, energy loss is reduced, and the flexural resonator having a compact size can be easily produced. In addition, the flexural resonator produced is highly reliable.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to the accompanying drawings. It should be noted that the embodiments described below are merely examples of the invention.

1. Flexural Resonator Element

For example, a flexural resonator element according to the embodiments of the invention may be of a single beam type, a tuning fork type, a double-ended tuning fork type, or a combination type thereof (such as a so-called double T-shaped resonator element). Among them, exemplary embodiments of a tuning fork flexural resonator element, a double-ended tuning fork flexural resonator element, and a double T-shaped flexural resonator element will be sequentially described hereinafter.

1-1. Tuning Fork Flexural Resonator Element

Figure 1:
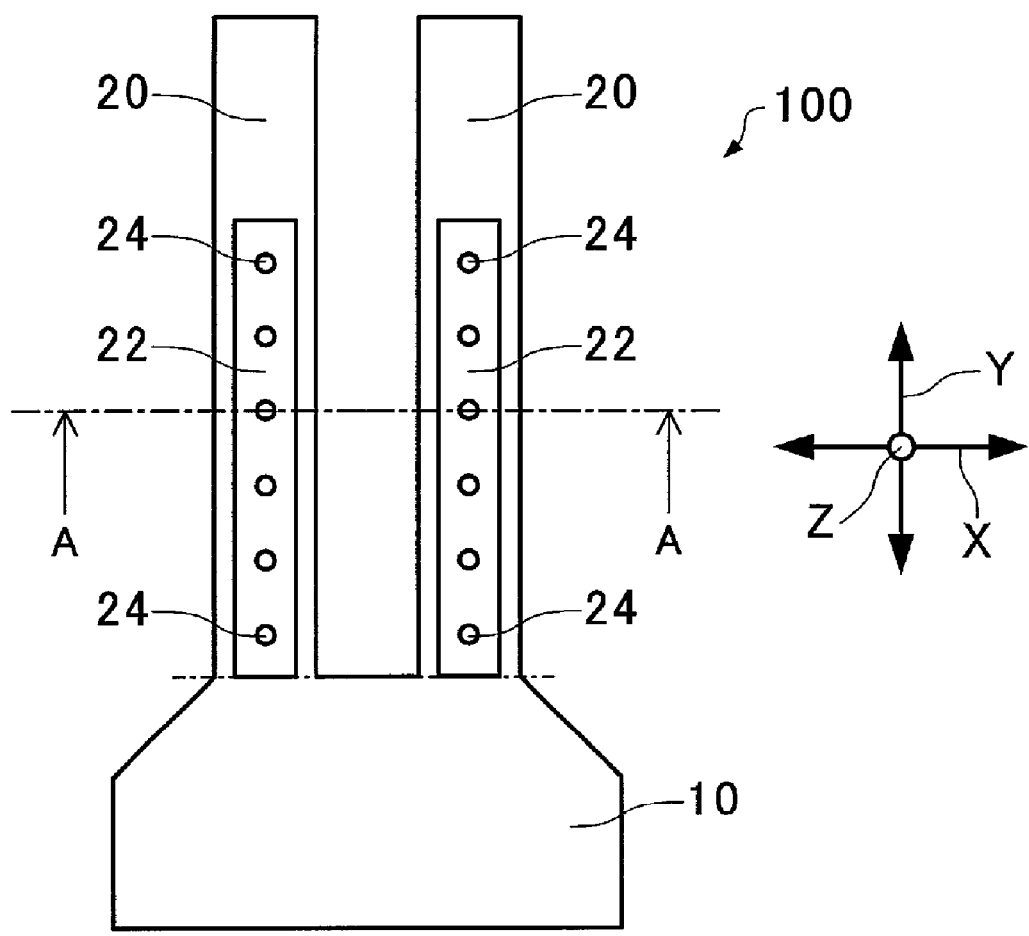
FIG. 1 is a plan view schematically showing a flexural resonator element 100 according to a first embodiment of the invention.
Figure 2A:
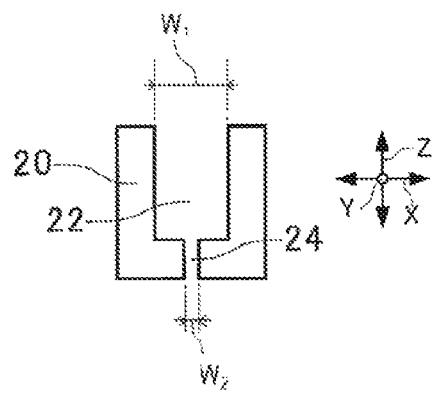
FIGS. 2A and 2B are sectional views schematically showing an example of a shape of a beam in the flexural resonator element 100 of the first embodiment.
Figure 2B:
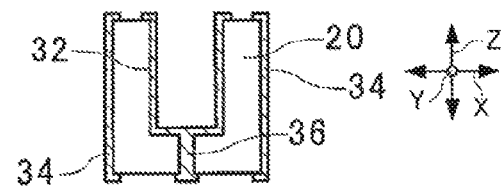
Figure 3A:
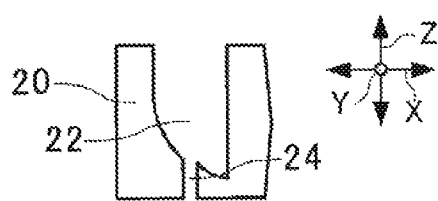
FIGS. 3A and 3B are sectional views schematically showing a modified example of the shape of the beam in the flexural resonator element 100 of the first embodiment.
Figure 3B:
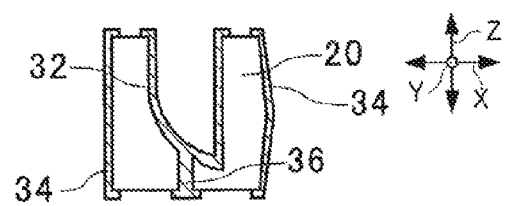
Figure 4A:
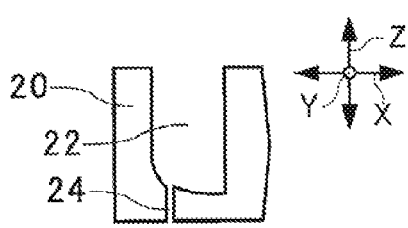
FIGS. 4A and 4B are sectional views schematically showing another modified example of the shape of the beam in the flexural resonator element 100 of the first embodiment.
Figure 4B:
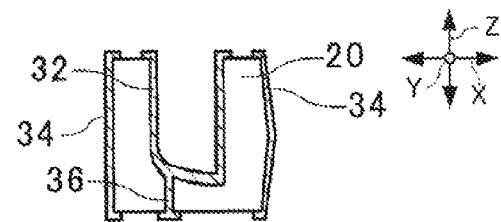
Figure 5:
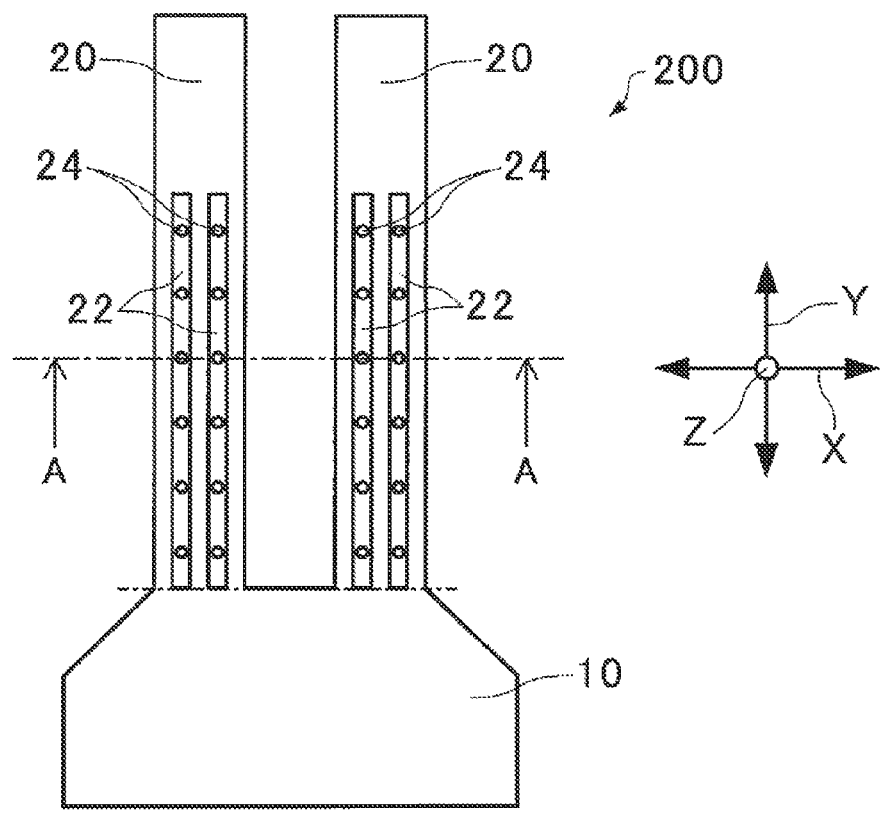
FIG. 5 is a plan view schematically showing a flexural resonator element 200 according to a second embodiment of the invention.
Figure 6A:
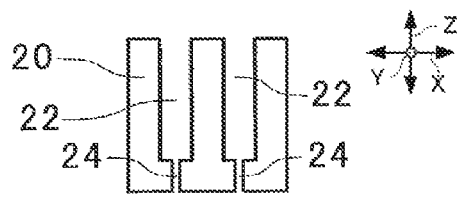
FIGS. 6A and 6B are sectional views schematically showing an example of a shape of a beam in the flexural resonator element 200 of the second embodiment.
Figure 6B:
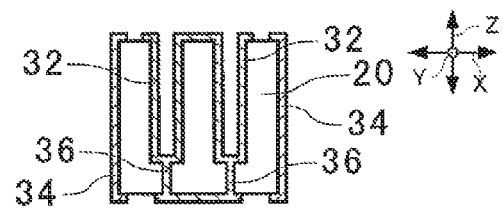
Figure 7A:
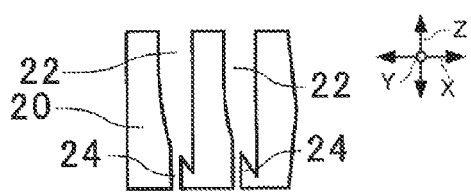
FIGS. 7A and 7B are sectional views schematically showing a modified example of the shape of the beam in the flexural resonator element 200 of the second embodiment.
Figure 7B:
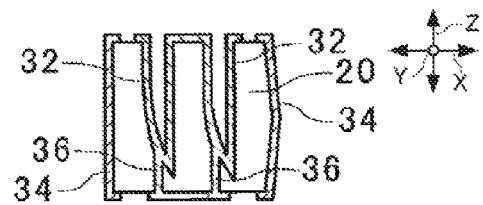
Figure 8:
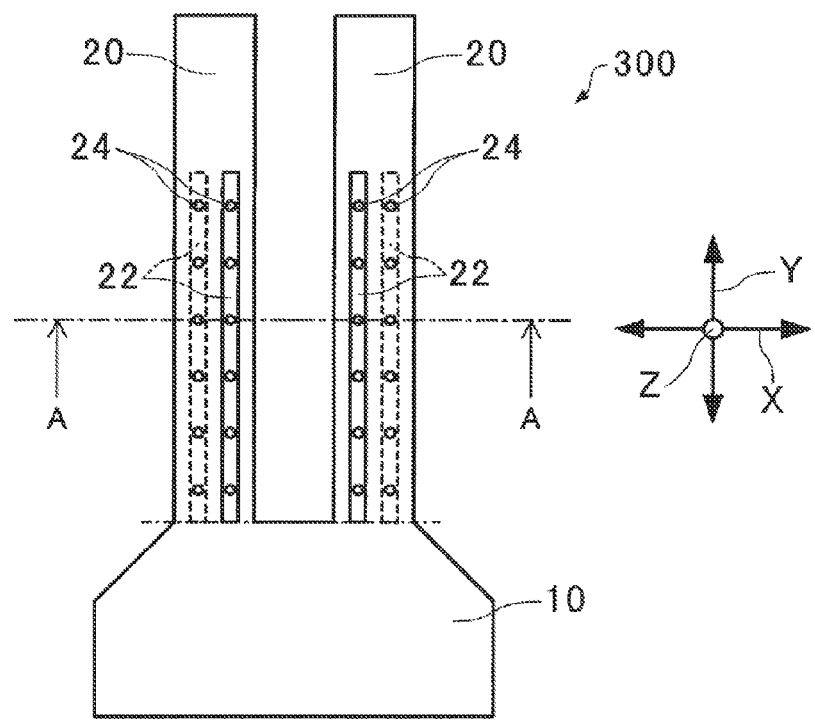
FIG. 8 is a plan view schematically showing a flexural resonator element 300 according to a third embodiment of the invention.
Figure 9A:
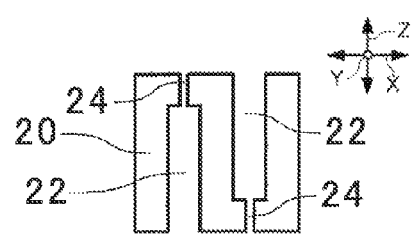
FIGS. 9A and 9B are sectional views schematically showing an example of a shape of a beam in the flexural resonator element 300 of the third embodiment.
Figure 9B:
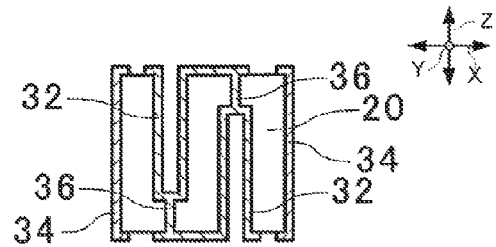
Figure 10A:
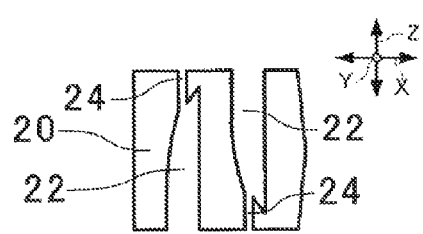
FIGS. 10A and 10B are sectional views schematically showing a modified example of the shape of the beam in the flexural resonator element 300 of the third embodiment.
Figure 10B:
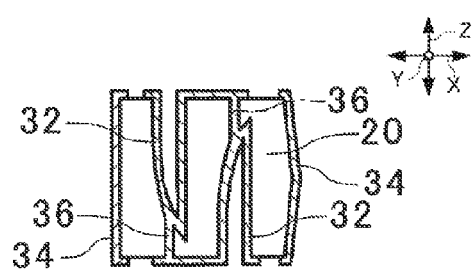
Figure 11:
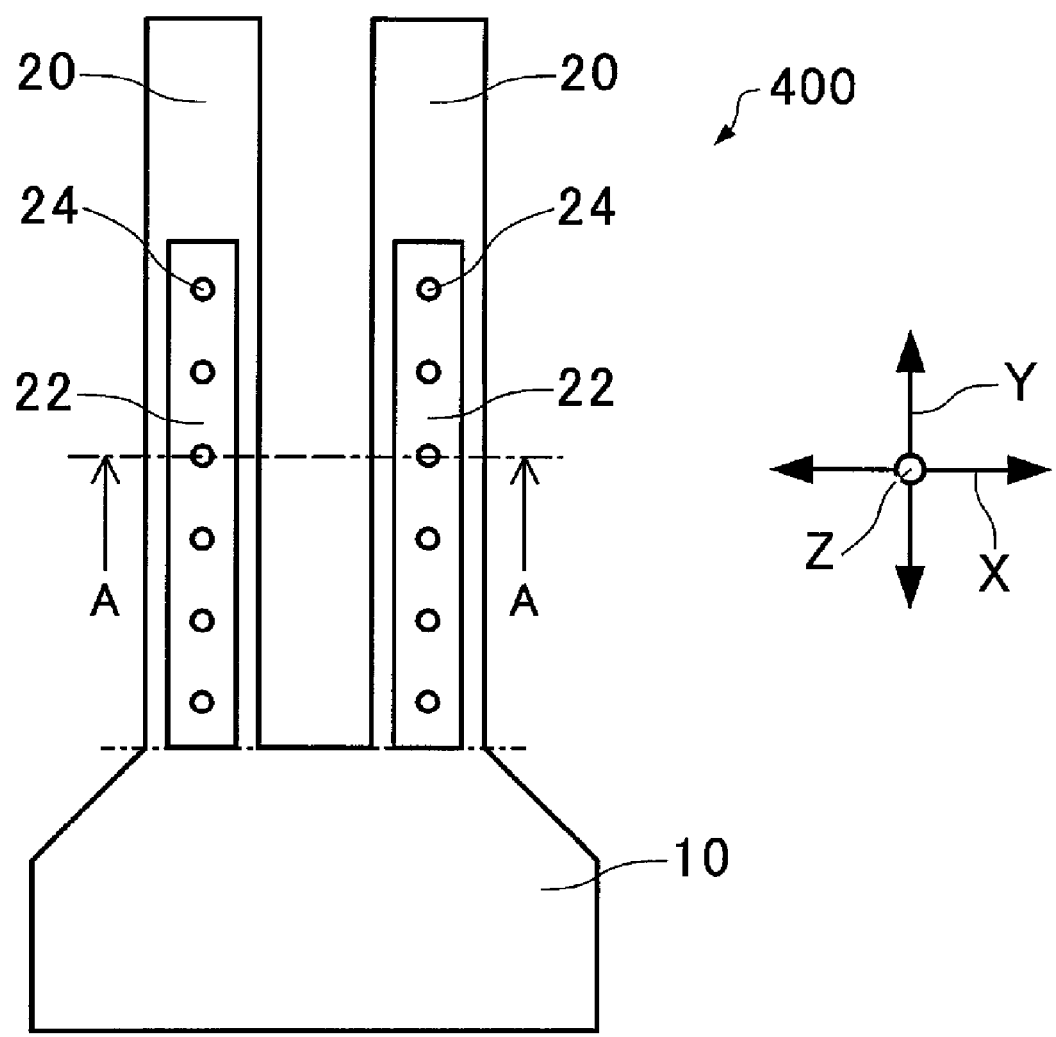
FIG. 11 is a plan view schematically showing a flexural resonator element 400 according to a fourth embodiment of the invention.
Figure 12A:
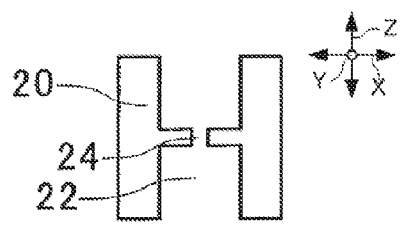
FIGS. 12A and 12B are sectional views schematically showing an example of a shape of a beam in the flexural resonator element 400 of the fourth embodiment.
Figure 12B:
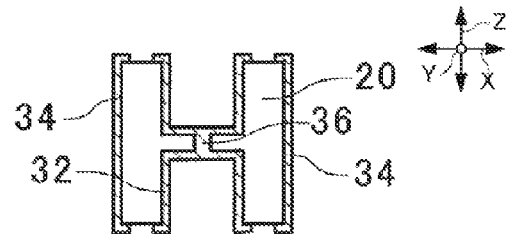
Figure 13A:
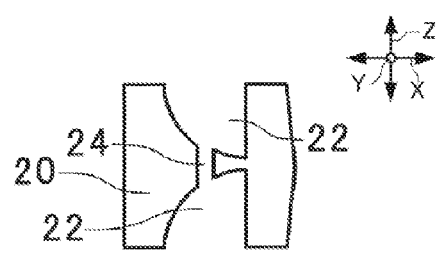
FIGS. 13A and 13B are sectional views schematically showing a modified example of the shape of the beam in the flexural resonator element 400 of the fourth embodiment.
Figure 13B:
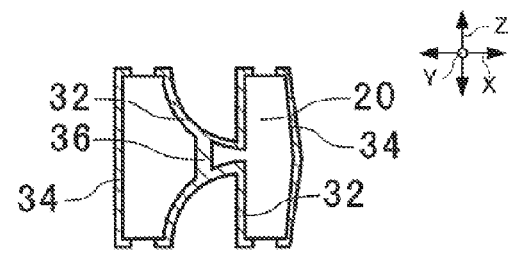
Figure 14A:
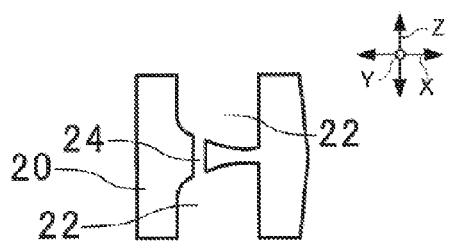
FIGS. 14A and 14B are sectional views schematically showing another modified example of the shape of the beam in the flexural resonator element 400 of the fourth embodiment.
Figure 14B:
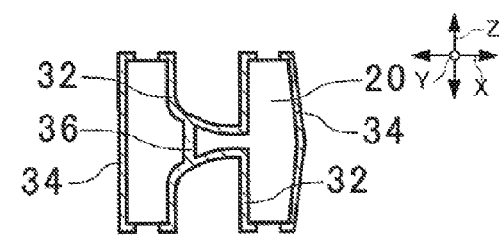
Figure 15:
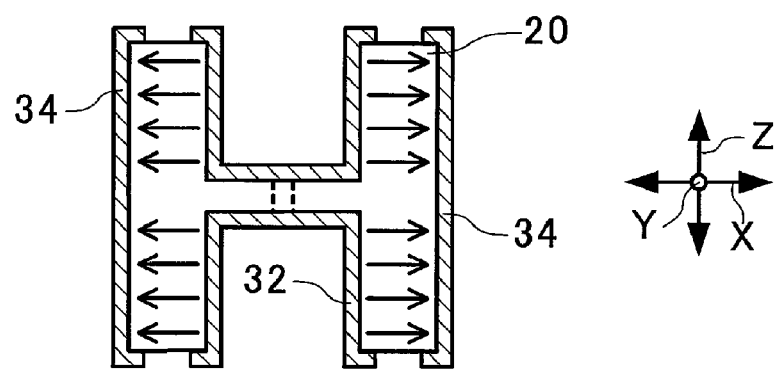
FIG. 15 is a schematic diagram illustrating an electric field applied to the beam of the flexural resonator element 400.

FIGS. 1 to 14 are schematic views showing examples of the flexural resonator element according to respective embodiments of the invention. The drawings show respective examples of a tuning fork flexural resonator element. FIG. 1 is a plan view schematically showing a flexural resonator element 100 according to a first embodiment of the invention. FIGS. 2A, 2B to FIGS. 4A, 4B are sectional views schematically showing examples of a shape of a beam included in the flexural resonator element 100. FIG. 5 is a plan view schematically showing a flexural resonator element 200 according to a second embodiment of the invention. FIGS. 6A, 6B and FIGS. 7A, 7B are sectional views schematically showing examples of a shape of a beam included in the flexural resonator element 200. FIG. 8 is a plan view schematically showing a flexural resonator element 300 according to a third embodiment of the invention. FIGS. 9A, 9B and FIGS. 10A, 10B are sectional views schematically showing examples of a shape of a beam included in the flexural resonator element 300. FIG. 11 is a plan view schematically showing a flexural resonator element 400 according to a fourth embodiment of the invention. FIGS. 12A, 12B to FIGS. 14A, 14B are sectional views schematically showing examples of a shape of a beam included in the flexural resonator element 400. Each of the sectional views corresponds to a section taken along line A—A drawn in an each corresponding plan view. In each plan view and in each left-side sectional view of the beam, there is not shown any electrode. FIG. 15 is a schematic diagram illustrating an electric field applied to a beam 20 included in the flexural resonator elements above.

The flexural resonator element according to the embodiments of the invention includes a base body 10 and the beam 20. The flexural resonator elements 100 to 400 exemplified in the respective drawings include two beams 20. The two beams 20 vibrate in directions coming close to and apart from each other.

The base body 10 may serve as a base portion of each of the flexural resonator elements 100 to 400. Specifically, the base body 10 may be used as a portion where any one of the flexural resonator elements 100 to 400 is fixed to a package or a portion where there is formed a pad for outwardly leading the electrode formed on each of the beams 20. The base body 10 may be formed integrally with the beams 20. The base body 10 has an arbitrary shape. For example, the base body 10 may have an approximately rectangular parallelepiped shape as shown in the drawings or a frame shape surrounding peripheries of the beams 20 so as to support the beams 20 within the frame. In addition, the base body 10 may have a substrate-like shape having a thickness in a Z direction and expanded in a direction parallel to an XY plane orthogonal to the Z direction (the Z direction and the XY plane may be the same as those defined in a description of the beams 20 that will be described later). The thickness of the base body 10 may be the same as or different from that of the beams 20. The base body 10 may have piezoelectric properties. A material of the base body 10 can be arbitrarily selected. The base body 10 formed integrally with the beams 20 described later may be made of a same material as that of the beams 20, for example, a piezoelectric material such as quartz crystal, lithium tantalite, or lithium niobate.

Each of the beams 20 is extended from the base body 10. In the present specification, an extending direction of the each beam 20 is referred to as a Y direction. The beam 20 is extended in the Y direction from the base body 10 and flexurally vibrates in an X direction orthogonal to the Y direction. Accordingly, it can be said that the beams 20 flexurally vibrate in the XY plane. Additionally, in the specification, a direction orthogonal to the X direction and the Y direction is referred to as the Z direction. The beams 20 can serve as a vibrating portion in the flexural resonator elements 100 to 400. The each beam 20 has a columnar shape. For example, a section of the beam 20 taken along a ZX plane may have a polygonal or quadrangular shape. In the examples shown in the drawings, an outline (envelope) of the section of the beam 20 taken along the ZX plane has an approximately square shape. Preferably, the beam 20 has a quadrangular prism shape because of easy production. The beams 20 are made of a piezoelectric material that allows flexural vibration upon application of a voltage signal. The material of the beams 20 may be quartz crystal, lithium tantalite, lithium niobate, or the like. The beams 20 made of any of the materials are formed so as to flexurally vibrate in the X direction by appropriately selecting a crystal azimuth of the material, locations of the electrodes formed on the beams 20, a driving method, and the like. When the beams 20 are made of quartz crystal, the beams 20 can be formed, for example, by patterning of a substrate called as a Z plate whose normal direction is positioned near a Z axis of the quartz crystal.

Each of the beams 20 includes a groove 22 and a through-hole 24.

The groove 22 is formed on at least one of two surfaces of the beam 20 perpendicular to the Z direction and is a recessed portion having a bottom and a depth in the Z direction. The groove 22 has an arbitrary shape. Preferably, the depth of the groove 22 is in a range of 10 to 90% of a thickness of the beam 20 in the Z direction. In addition, the depth of the groove 22 may have a distribution in the groove 22. In the example of FIG. 1, a planar shape of the groove 22 is a long and narrow rectangular shape extended in a lengthwise direction of the beam 20. However, instead of that, the groove 22 may have a round, oblong, or oval planar shape, for example. In the groove 22 with the long and narrow planar shape, heat conduction between portions of the beam 20 positioned on opposite sides of the groove 22 can be more efficiently suppressed. For example, a planar size of the groove 22 may be in a range of 10 to 80% of a length of the beam 20. Preferably, the groove 22 is formed so as to be closer to a portion of the beam 20 connecting with the base body 10. This allows the groove 22 to be positioned in a region exhibiting a large amount of deformation when the beam 20 is bent, so that a mass can be left near a top end of the beam 20. Furthermore, in association with leading of the electrode or the like, and when performing frequency adjustments of the flexural resonator elements 100 to 400 by adhering a weight material to the top end of each beam 20, it is unnecessary to form the groove 22 over an entire length of the beam 20.

The groove 22 may have a rectangular sectional shape, as shown in FIGS. 2A, 2B, FIGS. 6A, 6B, FIG. 8, and FIGS. 12A, 12B. Alternatively, the section of the groove 22 may have an asymmetrical shape, as shown in FIGS. 3A, 3B, FIGS. 4A, 4B, FIGS. 7A, 7B, FIGS. 10A, 10B, FIGS. 13A, 13B, and FIGS. 14A, 14B. The groove 22 having any of the exemplified sectional shapes can provide advantageous effects such as formation of a long heat conduction route.

As a function of the groove 22, there is mentioned a restriction of movement of heat generated on the beam 20. In addition, another function of the groove 22 is to increase an intensity of an electric field applied to the piezoelectric material of the beam 20 by using the electrode formed in the groove 22. Furthermore, the groove 22 can maintain mechanical strength of the beam 20 against bending, because the groove 22 has the bottom.

The groove 22 may be a single groove or include a plurality of grooves on the beam 20. For example, as shown in FIGS. 1 to 4B, a single groove 22 may be formed on a single beam 20. Alternatively, there may be formed two grooves 22 on the single beam 20, as shown in FIGS. 5 to 14B. In this case, both of the two grooves 22 may be provided on one of the surfaces of the beam 20 perpendicular to the Z direction (See FIGS. 5 to 7B), or each of the two grooves 22, respectively, may be formed on each of the surfaces of the beam 20 perpendicular to the Z direction (See FIG. 8 to FIG. 14B).

The through-hole 24 penetrates from an inner surface of the groove 22 to the surface of the beam 20 opposite to the surface thereof where the groove 22 is formed. In this case, penetration of the through-hole 24 from the inner surface of the groove 22 to "the surface" on an opposite side in the beam 20 means that even when the surface on the opposite side has an uneven portion due to a presence of an other groove or the like formed on the opposite surface, the through-hole 24 is formed so as to reach the surface on the opposite side from the inner surface of the groove 22. Accordingly, penetration of the through-hole 24 includes penetration to a recessed portion in the surface orthogonal to the Z axis, and is not restricted to the penetration from the inner surface of the groove 22 to "the surface" on the opposite side.

The through-hole 24 may be provided as a single through-hole or a plurality of through-holes in the single groove 22. Preferably, the through-hole 24 may be provided in a deep position in a depth direction of the groove 22 on the inner surface of the groove 22. This can further facilitate formation of the groove 22 (Details will be described later). The through-hole 24 has a round planar shape in the examples of the drawings but this is merely an example of the planar shape thereof. In addition, a planar size of the through-hole 24 can be arbitrarily determined as long as the groove 22 can have a bottom. Now, a width of the through-hole 24 will be described with reference to FIGS. 2A and 2B. The through-hole 24 is formed in such a manner that a width $W_2$ of the X direction is smaller than a width $W_1$ in an X-axis direction of an opening portion of the groove 22. In the embodiments, the through-hole 24 is formed such that the width $W_2$ is equal to or smaller than half of the width $W_1$. Preferably, the planar size of the through-hole 24 is made small to an extent not reducing the mechanical strength of the beam 20. When the plurality of through-holes 24 are provided, each of the through-holes 24 can be arranged in consideration of efficiency in formation of the groove 22. On an inner surface of the through-hole 24 may be provided a conductive plug 36.

One of functions of the through-hole 24 is to increase efficiency of etching in formation of the groove 22. In other words, forming the groove 22 by performing wet etching on the beam 20 can prevent etching efficiency from being reduced due to stagnation of an etchant in a deep position of the groove 22. In that case, the etchant can be circulated via the through-hole 24, so that the groove 22 can be formed with a narrow width and a large depth. Such an advantageous effect becomes more noticeable in the flexural resonator elements 100 to 400 that are more compact in size and include the beams 20 having a narrower width. Thus, the through-hole 24 has an advantageous effect that facilitates miniaturization of the flexural resonator elements 100 to 400.

Additionally, another function of the through-hole 24 is to control the sectional shape of the groove 22 by selecting an arrangement of the through-hole 24. This will be described with reference to FIGS. 3A, 3B and FIGS. 4A, 4B. As shown in the drawings, depending on the material of the beam 20, an etching rate of the wet etching can be anisotropic. As this case, for example, the beam 20 may be made of quartz crystal and a portion near the Z axis of the quartz crystal may be oriented in the Z direction of the beam 20. In this situation, as shown in FIGS. 3A and 3B, the etching rate in a specific direction becomes smaller than in other directions and thereby the sectional shape of the groove 22 may become close to a triangular shape. In this case, the advantageous effect of the through-hole 24 facilitating formation of the groove 22 is exhibited. Then, furthermore, by selecting a position for forming the through-hole 24, the sectional shape of the groove 24 can be made close to a rectangular shape. In other words, as shown in FIGS. 4A and 4B, the groove 22 can have a rectangular-like sectional shape by arranging the through-hole 24 in consideration of anisotropy of etching in advance when forming the groove 22. This takes advantage of a phenomenon that the etching rate becomes higher in a region near the through-hole 24 than in other regions due to circulation of the etchant through the through-hole 24. FIGS. 13A, 13B and FIGS. 14A, 14B show examples in which the two grooves 22 are formed to be opposed to each other. In the examples also, the same advantageous effect can be obtained by selecting the arrangement of the through-hole 24.

Furthermore, the through-hole 24 can also serve to prevent separation of the electrode formed inside the groove 24 by forming the plug 36 in the through-hole 24 and to allow a connection between electrodes of an upper surface and a lower surface of the beam 20 via the through-hole 24.

The beam 20 may include at least one electrode. For example, as shown in respective right-side sectional views of the drawings, the beam 20 includes a first electrode 32 on the inner surface of the groove 22 and a second electrode 34 on a surface of the beam 20 perpendicular to the X direction. The first and the second electrodes 32 and 34 may be formed up onto a surface of the beam 20 perpendicular to the Z direction. The first and the second electrodes 32 and 34 can be connected to a not-shown external circuit element or the like. In addition, the first and the second electrodes 32 and 34 can serve as a driving electrode and/or a detection electrode. For example, when an alternating current signal is input to the first and the second electrodes 32 and 34, at a moment in which the first electrode 32 is at higher potential than the second electrode 34, as shown in FIG. 15, an electric field is applied to portions near opposite ends of the beam 20 in the X direction in mutually opposite directions and thereby the beam 20 can be bent. On the other hand, at a moment in which the first electrode 32 is at lower potential than the second electrode 34, the beam 20 can be bent in an opposite direction. The groove 22 allows the arrangement of the electrodes as above, whereby a distance between the opposing electrodes can be reduced and thus the intensity of the electric field applied to the piezoelectric material of the beam 20 can be increased. The first and the second electrodes 32 and 34 may be structured as a laminate of layers made of chromium (Cr) and gold (Au), for example.

The plug 36 may be formed on the inner surface of the through-hole 24. The plug 36 may have conductive properties and may be made of a metal such as Au, for example. As in the examples of the drawings, the plug 36 may be formed so as to fill an inside of the through-hole 24. Alternatively, the plug 36 may be protruded on a surface of the beam 20 not in contact with the first electrode 32 as in the examples of the drawings.

When the groove 22 is formed only on the one of the surfaces of the beam 20 perpendicular to the Z direction (FIGS. 2A to 4B, FIGS. 6A, 6B, and FIGS. 7A, 7B) and the plug 36 is formed on the inner surface of the through-hole 24, the first electrode 32 and the plug 36 may be connected to each other. This structure can provide an advantageous effect that prevents separation of the first electrode 32 from the inner surface of the groove 22. In this case, a portion of the plug 36 protruded on the surface of the beam 20 not in contact with the first electrode 32 can serve as an anchor increasing the above advantageous effect.

When the groove 22 is formed on the opposite surfaces of the beam 20 perpendicular to the Z direction (FIGS. 9A, 9B, FIGS. 10A, 10B, and FIGS. 12A to 14B) and the plug 36 is formed on the inner surface of the through-hole 24, the first electrode 32 and the plug 36 may be connected to each other. This can prevent separation of the first electrode 32 from the inner surface of the groove 22, as well as can facilitate leading of wiring of the first electrode 32. In other words, when the first electrodes 32 on the opposite surfaces of the beam 20 are intended to have a same potential, wirings formed on the resonator elements can be simplified by using the plug 36. Consequently, using the plug 36 for the wiring can lead to reduction of problems such as wiring breaking and short circuit.

As described above, regarding the tuning fork flexural resonator elements 100 to 400 according to the embodiments, the beam 20 includes the groove 22. Thus, energy loss can be reduced. In addition, since the beam 20 also includes the through-hole 24, a compact resonator element can be produced easily. Furthermore, in the tuning fork flexural resonator elements 100 to 400 according to the embodiments, formation of the plug 36 on the inner wall of the through-hole 24 prevents problems such as electrode separation, wiring breaking, and short circuit, thereby increasing reliability. Still furthermore, the tuning fork flexural resonator elements 100 to 400 can, for example, generate a reference signal and thus can be applied to clocks and watches, data communication apparatuses, or the like.

1-2. Double T-shaped Flexural Resonator Element

Figure 16:
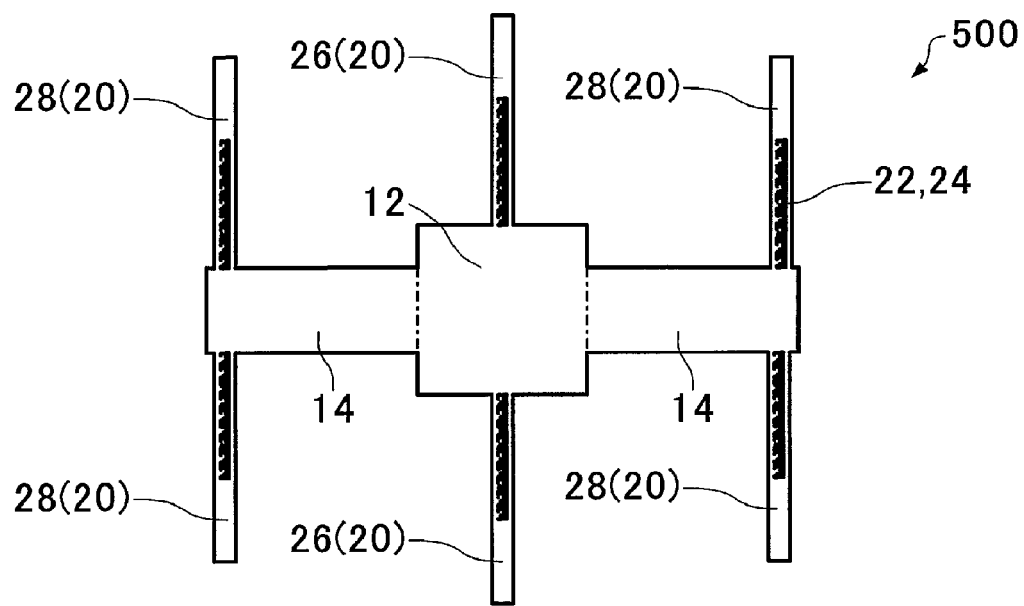
FIG. 16 is a plan view schematically showing a flexural resonator element 500 according to a fifth embodiment of the invention.

FIG. 16 is a plan view exemplifying a flexural resonator element 500 as an example of the flexural resonator element according to the embodiments. In FIG. 16, the flexural resonator element 500 is an example of a double T-shaped type.

The flexural resonator element 500 includes the base body 10 and the beam 20 having the groove 22 and the through-hole 24 formed thereon.

The beam 20 is the same as that in the flexural resonator elements 100 to 400. The groove 22 and the through-hole 24 formed on the beam 20 are also the same as those described above. Accordingly, the flexural resonator element 500 is the same as the flexural resonator elements 100 to 400 excepting that the structure of the base body 10 and the position and the functions of the beam 20 are different from those in the flexural resonator elements 100 to 400. Thus, descriptions of same parts will be omitted below.

The base body 10 of the flexural resonator element 500 includes a base portion 12 and a pair of connecting portions 14. The base portion 12 is formed so as to include a position of the center of gravity of the flexural resonator element 500, so that the base portion 12 may serve to support the flexural resonator element 500. In the example shown in the drawing, the base portion 12 has a rectangular planar shape, but this is merely an example of the base portion 12.

The pair of connecting portions 14 are extended in directions opposite to each other from the base portion 12. Specifically, the connecting portions 14 are extended in the direction (the X direction) orthogonal to the direction (the Y direction) in which the beam 20 is extended. The connecting portions 14 serve to support the beam 20 to be driven. The connecting portions 14 in the example of the drawing have a rectangular planar shape, but may have an alternative shape.

The flexural resonator element 500 includes a pair of detection beams 26 (20) extended in directions opposite to each other from the base portion 12 and two pairs of driving beams 28 (20) extended in directions opposite to each other from the connecting portions 14. The beams 20 included in the flexural resonator element 500 are all extended in the Y direction and flexurally vibrate in the X direction. Naming of the double T-shape stems from a type in which the driving beams 28 (20) protruded from the connecting portions 14 form an alphabetical T-like shape and such two T-like shapes are connected to each other. However, the shape of the flexural resonator element 500 of the embodiment is not specifically restricted by the name of the double T-shaped type.

Similarly to the flexural resonator elements 100 to 400, the flexural resonator element 500 described above includes the beams 20 with the groove 22 formed thereon, thereby reducing energy loss. In addition, since the through-hole 24 is formed in each of the beams 20, the flexural resonator element 500 having a compact size can be produced easily. Furthermore, in the flexural resonator element 500, forming the plug 36 on the inner wall of the through-hole 24 can prevent problems such as electrode separation, wiring breaking, and short circuit, thereby increasing reliability. The flexural resonator element 500 can detect, for example, acceleration and angular acceleration and thus can be applied to digital cameras, motor vehicles, or the like.

1-3. Double-Ended Tuning Fork Resonator Element

Figure 17:
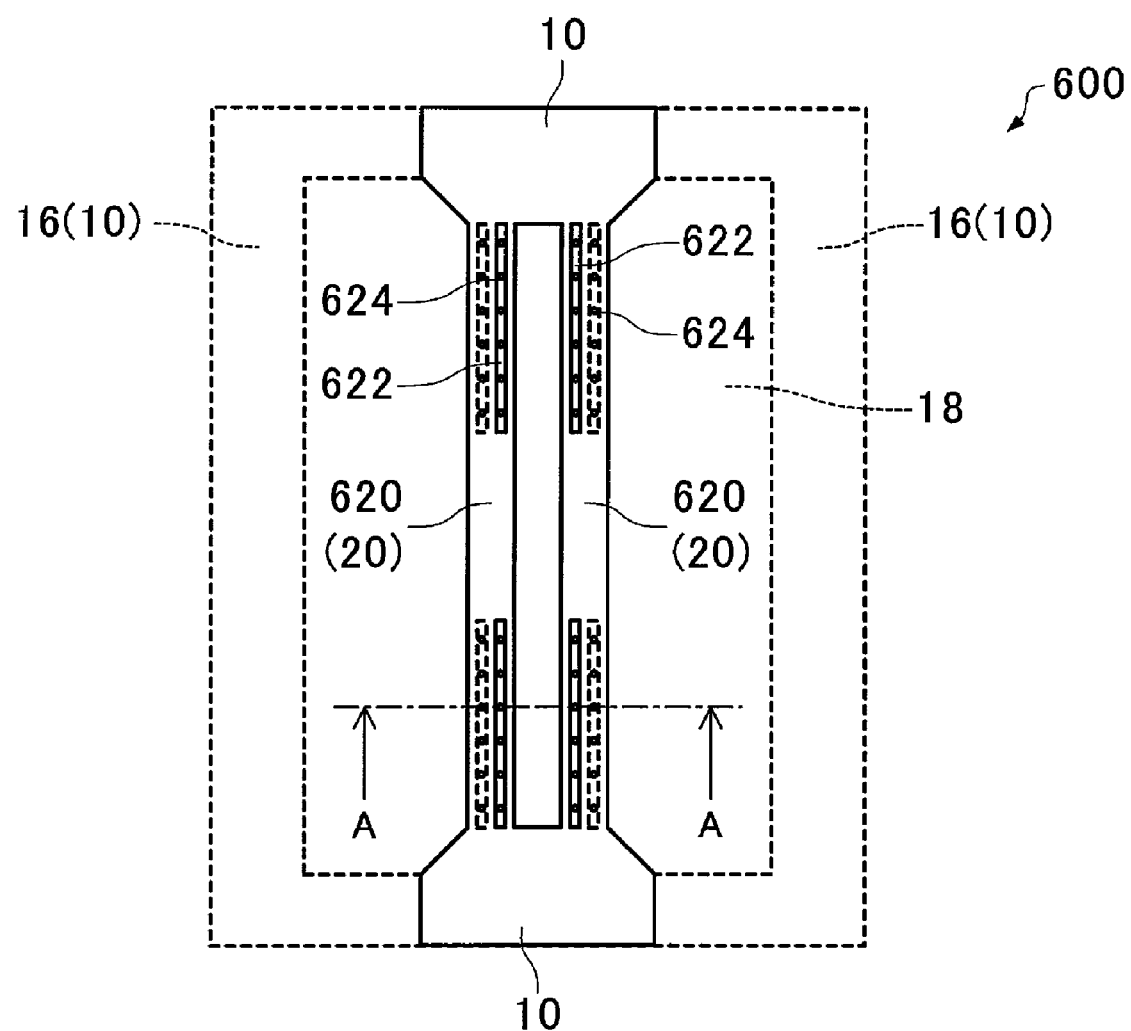
FIG. 17 is a plan view schematically showing a flexural resonator element 600 according to a sixth embodiment of the invention.

FIG. 17 is a plan view exemplifying a flexural resonator element 600 as an example of the flexural resonator element according to the embodiments. In FIG. 17, the flexural resonator element 600 is an example of a double-ended tuning fork resonator element.

The flexural resonator element 600 includes two base bodies 10. The base bodies 10 in the flexural resonator element 600 are substantially the same as the base body 10 in the flexural resonator elements 100 to 400. As indicated by broken lines in FIG. 17, the base bodies 10 of the flexural resonator element 600 may form a frame-shaped (a picture frame-shaped) portion 16 having an opening portion 18 formed within the frame-shaped portion 16. In the example of the drawing, the frame-shaped portion 16 has a rectangular shape, but this is merely an example of the shape thereof. In formation of the frame-shaped portion 16, the two base bodies 10 are integrated with each other by the frame-shaped portion 16. In this case, there may be formed two beams 620 in such a manner that opposite ends of the beams 620 are supported by the frame-shaped portion 16 of the base bodies 10 and the two beams 620 are bridged in parallel to each other in the opening portion 18. The frame-shaped portion 16 may be made of a same material as that of the base bodies 10. When the base bodies 10 include the frame-shaped portion 16, strength of the flexural resonator element 600 can be increased, thus facilitating handling or the like of the flexural resonator element 600.

The flexural resonator element 600 includes the two beams 620 formed in parallel to each other. The opposite ends of each of the beams 620 are supported by the base bodies 10. In the example of the drawing, the each beam 620 has four grooves 622 formed thereon. Each two of the four grooves 622, respectively, are formed on each of two surfaces of the beam 620 perpendicular to the Z direction.

The two beams 620 of the flexural resonator element 600 can be considered to be equivalent to the two beams 20 connected opposed to each other in the flexural resonator elements 100 to 400. An extending direction and a vibrating direction of each of the beams 620 are substantially the same as those of the beam 20.

Each of the beams 620 is extended from the base bodies 10 in the Y direction and flexurally vibrates in the X direction. In addition, the each beam 620 includes the grooves 622 and a through-hole 624.

As shown in FIG. 17, in the flexural resonator element 600, each beam 620 has the four grooves 622, each two of which are formed on a different one of the two surfaces of the beam 620 perpendicular to the Z direction. A sum of planar sizes of the four grooves 622 may be in a range of 10 to 80% of a length of the beam 620, for example. Preferably, the grooves 622 are formed so as to be closer to portions of the beam 620 connecting with the base bodies 10. This allows the grooves 622 to be positioned in a region exhibiting a large amount of deformation when the beam 620 is bent, so that a mass can be left near a center of the beam 620. Additionally, in association with leading of the electrode or the like, and when performing frequency adjustment of the flexural resonator element 600 by adhering a weight material to a top end of the beam 620, it is unnecessary to form the grooves 622 over an entire length of the beam 620.

A sectional shape and functions of the grooves 622 are substantially the same as those of the groove 20 included in the flexural resonator elements 100 to 400.

The through-hole 624 penetrates from an inner surface of the groove 622 to a surface of the beam 620 opposite to the surface thereof where the groove 622 is formed. Functions, mechanism, and advantageous effects of the through-hole 624 are the same as those of the through-hole 24 of the beam 20 in the flexural resonator elements 100 to 400, and thus descriptions of those parts will be omitted herein.

Similarly to the flexural resonator elements 100 to 400, in the flexural resonator element 600 described above, the beam 620 has the grooves 622 formed thereon to reduce energy loss. In addition, the beam 620 also has the through-hole 624 formed therein, thereby facilitating production of a compact flexural resonator element. Furthermore, in the flexural resonator element 600, forming a plug on an inner wall of the through-hole 624 can prevent problems such as electrode separation, wiring breaking, and short circuit, thereby increasing reliability. For example, the flexural resonator element 600 can detect stress in the Y direction, thus being applicable to pressure sensors or the like.

2-1. Method for Producing Flexural Resonator Element

The flexural resonator element according to the embodiments may be produced by a following method, for example. FIGS. 18 to 27 are sectional views schematically showing steps for producing the flexural resonator element according to the embodiments. The following production method is merely an example.

Figure 18:
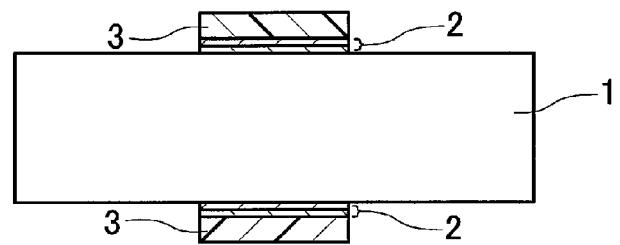
FIG. 18 is a sectional view schematically showing a step for producing the flexural resonator element according to the embodiments of the invention.

As shown in FIG. 18, first, there is prepared a Z plate of quartz crystal, as a substrate 1. The Z plate of quartz crystal may be cut out from a single crystal of quartz crystal by inclining an XY plane formed by an X axis and a Y axis at an angle of approximately 1 to 5 degrees around the X axis in a counterclockwise direction in an orthogonal coordinate system having the X, Y, and Z-axes.

Next, on each of upper and lower surfaces of the substrate 1 is formed a metal film 2 structured as a laminate of layers of Cr and Au, by a not-shown sputtering apparatus. Then, photolithography is used to perform patterning of a resist layer 3 or the like on the metal film 2 thus formed (See FIG. 18). The patterning has an outline shape of the flexural resonator element to be produced.

Figure 19:
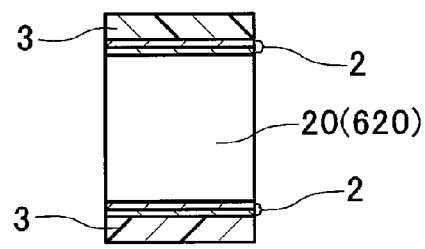
FIG. 19 is a sectional view schematically showing a step for producing the flexural resonator element according to the embodiments of the invention.

Next, as shown in FIG. 19, an outline of the flexural resonator element shown in the respective plan views above is formed by the patterning of the metal film 2. In this case, for example, etching using a hydrogen fluoride solution may be performed on the substrate 1. FIG. 19 shows a section of the beam 20 or the beam 620 in that situation.

Hereinafter, a description will be given separately of when the through-hole connects the inner surface of the groove to the surface of the beam opposite to the inner surface and when the through-hole connects the inner surface of the groove to an inner surface of another groove formed on the opposite surface of the beam.

Figure 20:
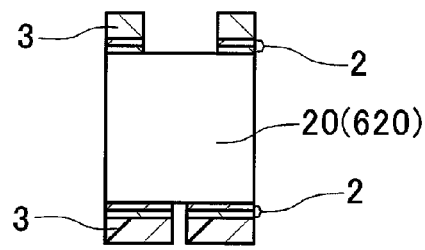
FIG. 20 is a sectional view schematically showing a step for producing the flexural resonator element according to the embodiments of the invention.

In the case of the through-hole connecting the inner surface of the groove to the opposite surface of the beam, as shown in FIG. 20, the patterning is made on the metal film 2 in accordance with the shapes of the groove and the through-hole. The patterning may be performed by forming a patterned resist mask on the metal film 2 in advance. In the patterning, a pattern of the groove 22 (622) is formed on the surface where the groove 22 (622) of the beam 20 (620) is to be formed, and a pattern of the through-hole 24 (624) is formed on the opposite surface (See FIG. 22).

Figure 21:
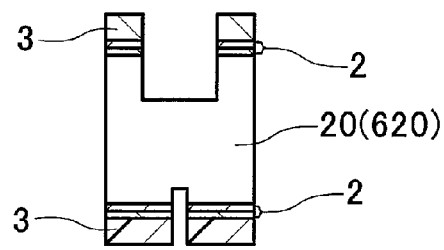
FIG. 21 is a sectional view schematically showing a step for producing the flexural resonator element according to the embodiments of the invention.
Figure 22:
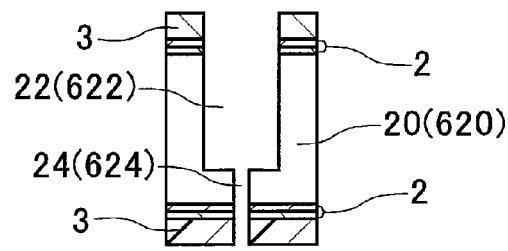
FIG. 22 is a sectional view schematically showing a step for producing the flexural resonator element according to the embodiments of the invention.

Then, as shown in FIGS. 21 and 22, the groove 22 (622) and the through-hole 24 (624) are formed by etching. The etching may be wet etching using hydrogen fluoride or the like. Wet etching achieves large etching rate, so that etching time can be reduced. FIG. 21 shows a situation during the etching in the step. As shown in FIG. 21, the etching of the step allows an etched top end of the groove to meet an etched top end of the through-hole at some point of the beam. In this example, the etching of the groove and the etching of the through-hole are simultaneously performed. However, a hole to be used as the through-hole 24 (624) may be formed before the etching of the groove. In this manner, as shown in FIG. 22, the flexural resonator element can be produced in such the manner that the through-hole connects the inner surface of the groove to the opposite surface of the beam.

Figure 23:
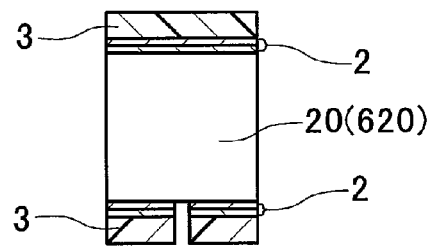
FIG. 23 is a sectional view schematically showing a step for producing the flexural resonator element according to the embodiments of the invention.

On the other hand, when the through-hole connects the inner surface of the groove to the inner surface of the other groove formed on the opposite surface of the beam, the outline of the flexural resonator element is formed as in FIG. 19, and then, patterning is performed on the metal film 2 formed on one of surfaces of the beam 20 (620) orthogonal to the Z direction, as shown in FIG. 23. The patterning corresponds to a position for forming the through-hole 24 (624). The patterning may be performed by forming a patterned resist mask on the metal film 2 in advance.

Figure 24:
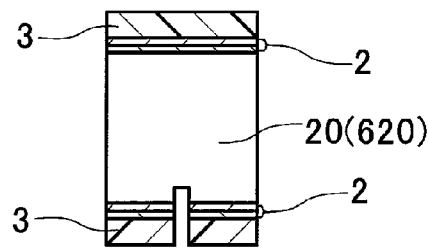
FIG. 24 is a sectional view schematically showing a step for producing the flexural resonator element according to the embodiments of the invention.

Next, as shown in FIG. 24, using the metal film 2 as a mask, the hole to be used as the through-hole 24 (624) is formed. The formed hole may have a depth ranging, for example, from 5 to 95% of a thickness of the beam 20 (620) in the Z direction. The step can be performed by dry etching or wet etching. When the step uses dry etching, the hole can be made more isotropic due to a small anisotropy in etching rate. As an example of dry etching, plasma etching may be used.

Figure 25:
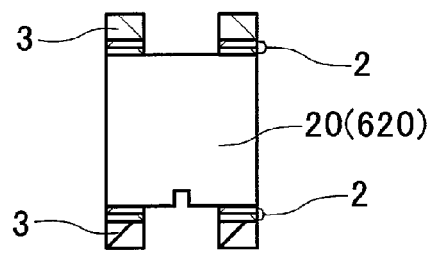
FIG. 25 is a sectional view schematically showing a step for producing the flexural resonator element according to the embodiments of the invention.
Figure 26:
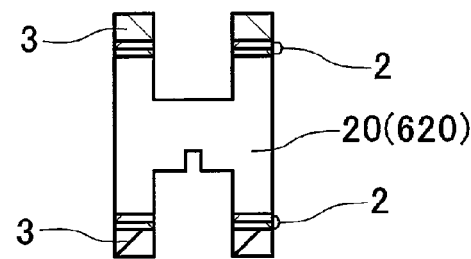
FIG. 26 is a sectional view schematically showing a step for producing the flexural resonator element according to the embodiments of the invention.
Figure 27:
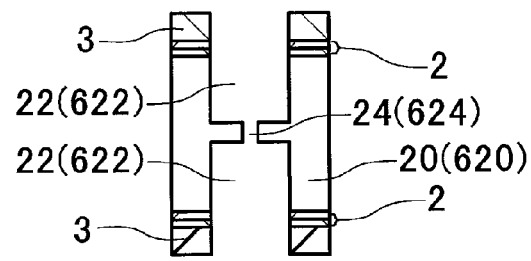
FIG. 27 is a sectional view schematically showing a step for producing the flexural resonator element according to the embodiments of the invention.

Next, as shown in FIG. 25, in order to form the groove 22 (622), patterning is further performed on the metal film 2. Then, as shown in FIGS. 26 and 27, the groove 22 (622) is etched. The etching may be wet etching using hydrogen fluoride or the like. Wet etching exhibits high etching rate, so that etching time can be reduced. FIG. 26 shows a situation during the etching in the step. At the step, the hole as the through-hole 24 (624) previously formed can be simultaneously etched in a manner maintaining a shape of the hole. Accordingly, the etching of the step, as shown in FIG. 26, allows the etched top end of the groove to meet an etched top of the hole as the through-hole at some point of the beam. Then, finally, as shown in FIG. 27, the flexural resonator element can be produced in such the manner that the through-hole connects the inner surface of the groove to the inner surface of the other groove formed on the opposite surface of the beam.

In the example described above, the depth of the hole as the through-hole 24 (624) can be designed in such the manner that the hole is connected to the deep position of the groove 22 (622) where etchant stagnation occurs upon etching of the groove 22 (622). This can optimize (minimize) a sum of a time for forming the hole as the through-hole 24 (624) and a time for forming the groove 22 (622).

As described above, the method of the embodiment can produce the flexural resonator element according to the embodiments. The production method according to the embodiment may further include forming an electrode if necessary. For example, there may be formed an electrode by providing a metal layer on an entire surface of the flexural resonator element by sputtering or the like and then patterning the metal layer.

The flexural resonator element production method of the embodiment includes following characteristics. At the step of forming the groove 22 (622) by wet etching of the beam 20 (620), the production method can prevent etching efficiency reduction due to stagnation of the etchant in the deep position of the groove 22 (622). In other words, the etchant can be circulated via the through-hole 24 (624) connected to the deep position of the groove 22 (622), so that the groove 22 (622) can be made narrow and deep. Therefore, the production method of the embodiment enables the narrow and deep groove to be easily formed on the beam, thereby facilitating production of a compact flexural resonator element.

3. Flexural Resonator

Figure 28:
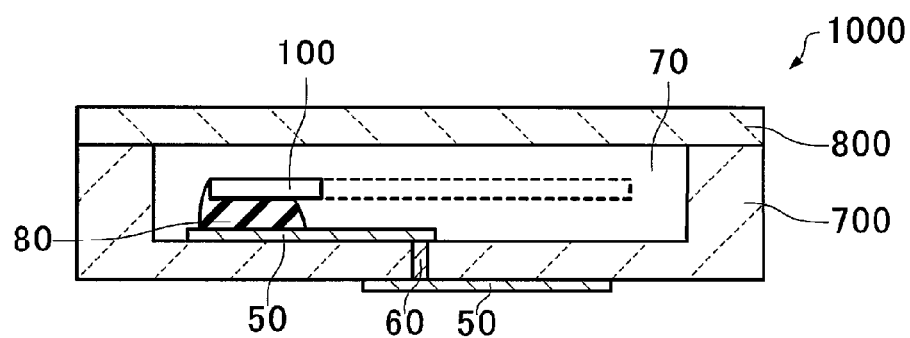
FIG. 28 is a sectional view schematically showing a flexural resonator 1000 according to an embodiment of the invention.

FIG. 28 is a sectional view schematically showing a flexural resonator 1000 according to an embodiment of the invention. The flexural resonator 1000 of the embodiment includes any one of the above-described flexural resonator elements, a casing 700, and a cover 800. In the example of the drawing, the flexural resonator 1000 includes the flexural resonator element 100.

The casing 700 has a container-like shape where the flexural resonator element 100 can be stored. A planar shape of the casing 700 is not specifically restricted. An upper part of the casing 700 has an opening enough to place the flexural resonator element 100 in the casing 700. The opening of the casing 700 can be airtightly sealed with the cover 800. Inside and outside the casing 700, there may be provided a wiring pattern 50 for external connection, as shown in the drawing. In addition, the casing 700 may include a through-hole 60, as in the drawing, so as to establish an electrical connection between an inside and an outside of the casing 700 via the through-hole 60. The casing 700 may be made of an inorganic material such as ceramic or glass.

The cover 800 has a flat plate-like shape to seal the opening of the upper part of the casing 700. The cover 800 has an arbitrary planar shape as long as the cover can seal the opening of the casing 700. The cover 800 is made of ceramic, glass, a metal, or the like. For example, the casing 700 may be adhered to the cover 800 by plasma welding, seam welding, ultrasonic bonding, an adhesive agent, or the like. A cavity 70 formed by the casing 700 and the cover 800 is a space where the flexural resonator element is driven. The cavity 70 can be sealed off, whereby the flexural resonator element can be placed in a pressure-reduced space or an inert-gas atmosphere.

The flexural resonator element is provided in the cavity 70 formed by the casing 700 and the cover 800. For example, the flexural resonator element may be fixed on an inner wall surface of the cavity 70 (a bottom surface of the casing 700 in the example of the drawing) by an adhesive agent, paste, wax, or the like. The flexural resonator element of the example of the drawing is fixed on the bottom surface of the casing 700 by an adhesive layer 80, and a base body 100 is fixed to the flexural resonator element to cantilever-support the resonator element.

The flexural resonator 1000 thus formed includes the flexural resonator element according to any one of the embodiments. Accordingly, the flexural resonator 1000 can reduce energy loss and can be easily produced as a compact flexural resonator. In addition, the flexural resonator 1000 including the flexural resonator element of any one of the embodiments has high reliability, and thus, can be applied to products in a variety of fields.

Embodiments of the invention are not restricted to the embodiments described above, and various modifications and changes can be made. For example, there may be embodiments of the invention that include substantially the same structures as those described in the embodiments (for example, functions, methods, and results may be the same as those in the embodiments, or advantages and advantageous effects may be the same as those in the embodiments). Additionally, an other embodiment of the invention may include a structure whose non-essential parts are different from those of the structures in the embodiments. Furthermore, there may be an embodiment including a structure that can provide the same advantageous effects as those described in the embodiments or a structure that can achieve the same advantages of the embodiments, as well as an embodiment including a known technique added to the structure described in the embodiments.

The flexural resonator element according to the embodiments reduces energy loss, has high reliability, and can be easily miniaturized. Accordingly, mounting the flexural resonator element of the embodiments in products of various fields allows production of more compact products achieving higher performance.

The entire disclosure of Japanese Patent Application No. 2009-034861, filed Feb. 18, 2009 is expressly incorporated by reference herein.

What is claimed is:

1. A flexural resonator element, comprising:
   a base body; and
      a beam with a groove and a through-hole, the beam being extended in a Y direction from the base body and flexurally vibrating in an X direction orthogonal to the Y direction,
   the groove being formed on a surface of the beam perpendicular to a Z direction orthogonal to the X direction and the Y direction, the groove formed on the surface of the beam includes two grooves, each of the two grooves is formed on a different one of two surfaces of the beam perpendicular to the Z direction, each of the two grooves is formed adjacent to the other groove such that the grooves do not overlap in plan view, and
   the through-hole having a smaller width in the X direction than a width of an opening of the groove in the X direction and penetrating from an inner surface of the groove formed on the surface of the beam to a surface of the beam opposite to the surface of the beam having the groove.

2. The flexural resonator element according to claim 1, wherein the through-hole includes a plurality of through-holes, the plurality of through-holes being formed in the groove.

3. The flexural resonator element according to claim 1, wherein the through-hole penetrates from the inner surface of the groove formed on one of the two surfaces of the beam to the inner surface of the groove formed on an other one of the two surfaces of the beam.

4. The flexural resonator element according to claim 1, wherein the beam includes a first electrode provided on the inner surface of the groove, a second electrode provided on a surface of the beam perpendicular to the X direction, and a plug provided on an inner surface of the through-hole.

5. The flexural resonator element according to claim 1, wherein the base body and the beam are made of quartz crystal.

6. The flexural resonator element according to claim 1, wherein the flexural resonator element is of a tuning fork type in which the beam includes two cantilevered beams extended in parallel to each other from the base body.

7. The flexural resonator element according to claim 1, wherein the base body includes a base portion and a pair of connecting portions extended from the base portion in directions opposite to each other, and the beam includes a pair of detection beams extended from the base portion in directions opposite to each other and two pairs of driving beams extended from the connecting portion in directions opposite to each other.

8. The flexural resonator element according to claim 1, wherein the flexural resonator element is of a double-ended tuning fork type in which the base body includes two base bodies, the beam includes two beams formed in parallel to each other, opposite ends of each of the two beams being supported by the two base bodies, and the groove formed on the each beam includes four grooves, each two of the four grooves being formed on a different one of the two surfaces of the beam perpendicular to the Z direction.

9. The flexural resonator element according to claim 8, wherein, in the flexural resonator element of the double-ended tuning fork type, the base bodies form a frame-shaped portion having an opening portion formed within the frame-shaped portion, and the two beams are formed in parallel to each other in the opening portion, the opposite ends of each of the beams being supported by the frame-shaped portion of the base bodies.

10. The flexural resonator element according to claim 8, wherein the each two grooves formed on the different one of the two surfaces of the beam are oriented in mutually opposite directions, and the through-hole penetrates from the inner surface of each of the grooves formed on one of the two surfaces to the inner surface of each of the grooves formed on an other one of the surfaces.

11. A flexural resonator, comprising:
the flexural resonator element of claim 1;
a casing housing the flexural resonator element; and
a cover sealing the casing.

12. The flexural resonator element according to claim 1, wherein each of the two grooves extends through the beam in the Z direction toward the different one of the two surfaces, and the through-hole passes continuously through the beam from the inner surface of the groove to the different one of the two surfaces.

* * * * *